US008693710B2

United States Patent
Chu et al.

(10) Patent No.: US 8,693,710 B2
(45) Date of Patent: Apr. 8, 2014

(54) APPARATUS FOR PREVENTING LEAKAGE OF A WEAK SIGNAL FROM A SPEAKER

(75) Inventors: Kwang Uk Chu, Seoul (KR); In Ho Hwang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 816 days.

(21) Appl. No.: 12/506,624

(22) Filed: Jul. 21, 2009

(65) Prior Publication Data

US 2010/0104109 A1 Apr. 29, 2010

(30) Foreign Application Priority Data

Oct. 24, 2008 (KR) .................. 10-2008-0104624

(51) Int. Cl.
*H04R 25/00* (2006.01)
*H03G 3/34* (2006.01)

(52) U.S. Cl.
CPC ...................................... *H03G 3/34* (2013.01)
USPC .......................................................... 381/163

(58) Field of Classification Search
USPC ............. 379/7, 35, 167.01, 167.15, 168, 169; 381/94.5, 163
See application file for complete search history.

(56) References Cited

U.S. PATENT DOCUMENTS

| 2,841,647 A | 7/1958 | Blow |
| 3,283,073 A | 11/1966 | Campbell |

FOREIGN PATENT DOCUMENTS

| JP | 61-262399 A | 11/1986 |
| JP | 05-264332 A | 10/1993 |
| KR | 1019990041875 A | 6/1999 |
| KR | 1020050102992 A | 10/2005 |
| KR | 1020090035832 A | 4/2009 |
| WO | 99/51010 A1 | 10/1999 |

OTHER PUBLICATIONS

HyperPhysics <http://hyperphysics.phy-astr.gsu.edu/hbase/electronic/limiter.html>.*
European Search Report: EP 09 16 6026.

* cited by examiner

*Primary Examiner* — Duc Nguyen
*Assistant Examiner* — Kile Blair
(74) *Attorney, Agent, or Firm* — Ladas & Parry LLP

(57) ABSTRACT

An apparatus for preventing leakage of a weak signal from a speaker is provided. The apparatus passes a normal speaker drive signal coming through speaker signal lines and blocks a weak signal generated by the sounds around the speaker, thereby preventing wiretapping the speaker.

5 Claims, 9 Drawing Sheets

APPARATUS FOR PREVENTING LEAKAGE OF A WEAK SIGNAL FROM A SPEAKER

CROSS-REFERENCE TO RELATED APPLICATION

This application claims priority to and the benefit of Korean Patent Application No. 10-2008-0104624, filed Oct. 24, 2008, the disclosure of which is incorporated herein by reference in its entirety.

BACKGROUND

1. Field of the Invention

The present invention relates to an apparatus for preventing leakage of a weak signal from a speaker, and more particularly, to an apparatus for preventing leakage of a weak signal from a speaker, which passes a normal speaker drive signal coming from an audio system through speaker signal lines and blocks a weak signal generated by the sounds around the speaker.

2. Discussion of Related Art

A speaker, which is a device for generating sound, can be maliciously used for eavesdropping in some situation, since it has a structure similar to a microphone. FIGS. 1A and 1B are schematic diagrams showing structures of a speaker 100a and a microphone 100b respectively, and FIG. 1C is a schematic diagram showing a structure of a broadcast speaker for announcement, 100c.

Referring to FIG. 1A, the conventional speaker 100a has a structure including a voice coil 120a surrounding a permanent magnet 110a and a diaphragm 130a attached to the voice coil 120a. When an output current of a signal generator D1 is transmitted through speaker signal lines 140a and flows to the voice coil 120a, the diaphragm 130a moves according to the electromagnetic force by the Lorentz force law, thereby generating sound.

Referring to FIG. 1B, the microphone 100b has the similar structure as the speaker 100a. When the diaphragm 130b is moved by microphone-around sounds, a current flows in the voice coil 120b according to electromagnetic induction. The current is transmitted to a signal receiver D2 through the microphone signal lines 140b.

As described above, the speaker 100a have basically the similar structure as the microphone 100b, so a current may be generated by speaker-around sounds and flows in the voice coil 120a of the speaker 100a, as in the microphone 10b. In this case, when the current flowing in the voice coil 120a is leaked through the speaker signal lines 140a, the conversation around the speaker may be eavesdropped.

Specifically, when broadcast speakers for announcement are installed at multiple positions, conversations around all speakers connected to the common signal lines may be eavesdropped simultaneously if a person branches off the common signal lines.

Referring to FIG. 1C, the broadcast speaker 100c generally includes a transformer 160 which is used to minimize the transmission power loss but may make eavesdropping easy because it amplifies a weak signal of the voice coil 120a.

SUMMARY OF THE INVENTION

The present invention provides an apparatus for preventing a weak signal generated by the sounds around the speaker from being leaked through speaker signal lines.

According to an aspect of the present invention, there is provided an apparatus for preventing leakage of a weak signal from a speaker, including: a bidirectional threshold element configured to conduct only when a voltage difference between both sides is larger than a predetermined value, wherein the bidirectional threshold element passes a speaker drive signal coming through speaker signal lines and blocks a weak signal coming from a voice coil of the speaker.

The bidirectional threshold element may include two parallel diodes connected in an opposite direction or two serial Zener diodes connected in an opposite direction.

The bidirectional threshold element may include at least one varistor.

The apparatus may further include: a low pass filter for blocking a noise or an abnormal signal whose frequency is above the audible frequency. The low pass filter may include inductors and capacitors.

The apparatus may further include: a high pass filter for bypassing a noise or an abnormal signal whose frequency is above the audible frequency to another path. The high pass filter may include capacitors.

The apparatus may further include: a limiter for limiting a voltage difference between the speaker signal lines to be less than a predetermined value. The limiter may include a varistor.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

An apparatus for preventing leakage of a weak signal from a speaker according to exemplary embodiments of the present invention will be described in detail herein below with reference to the accompanying drawings.

Figure 1A:
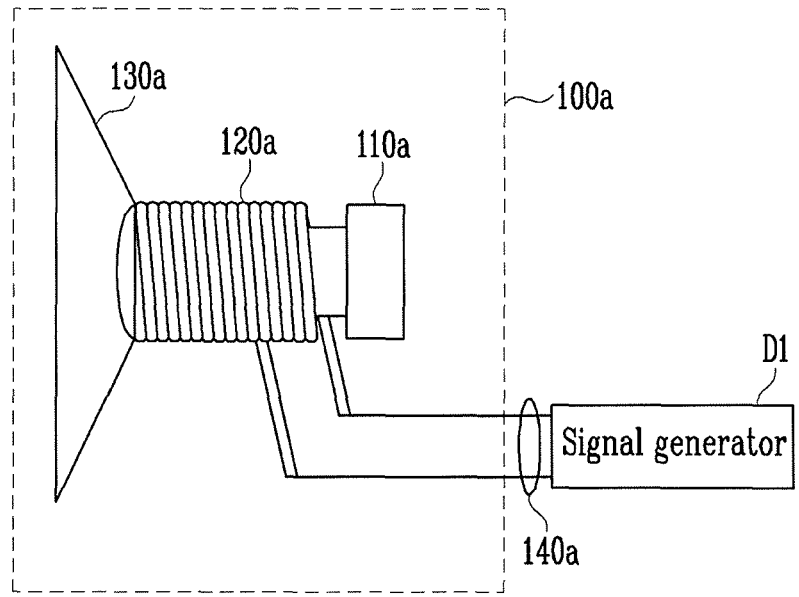
FIGS. 1A and 1B are schematic diagrams showing structures of a speaker and a microphone.
Figure 1B:
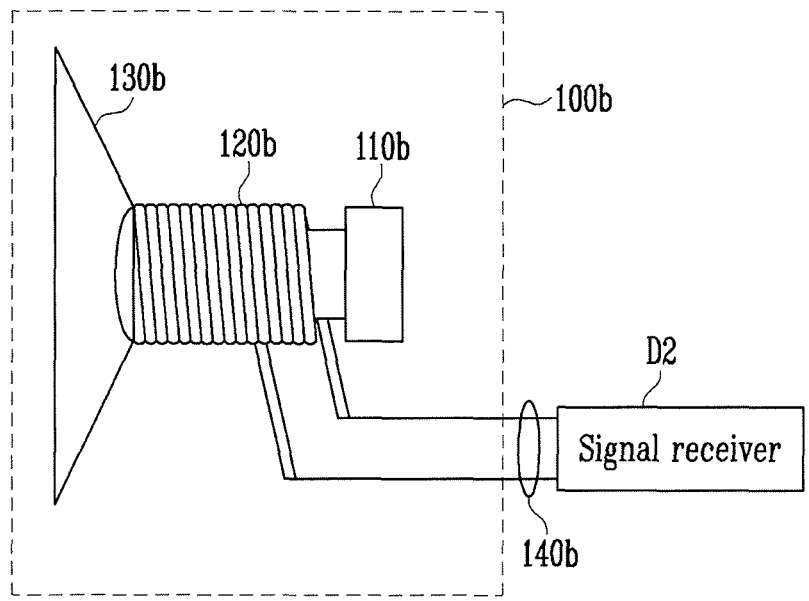
Figure 1C:
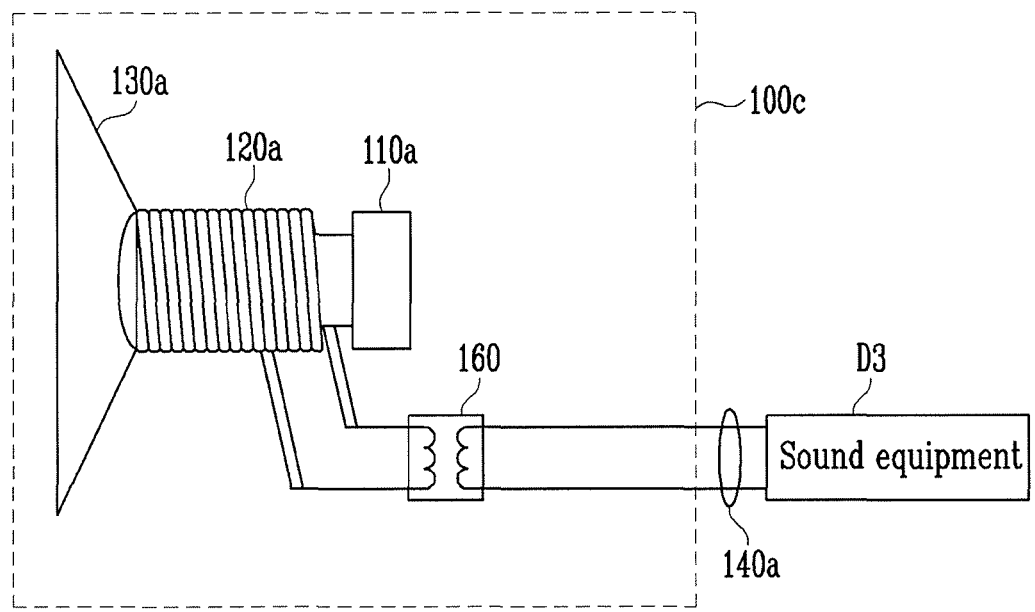
FIG. 1C is a schematic diagram showing a structure of a broadcast speaker for announcement.
Figure 2A:
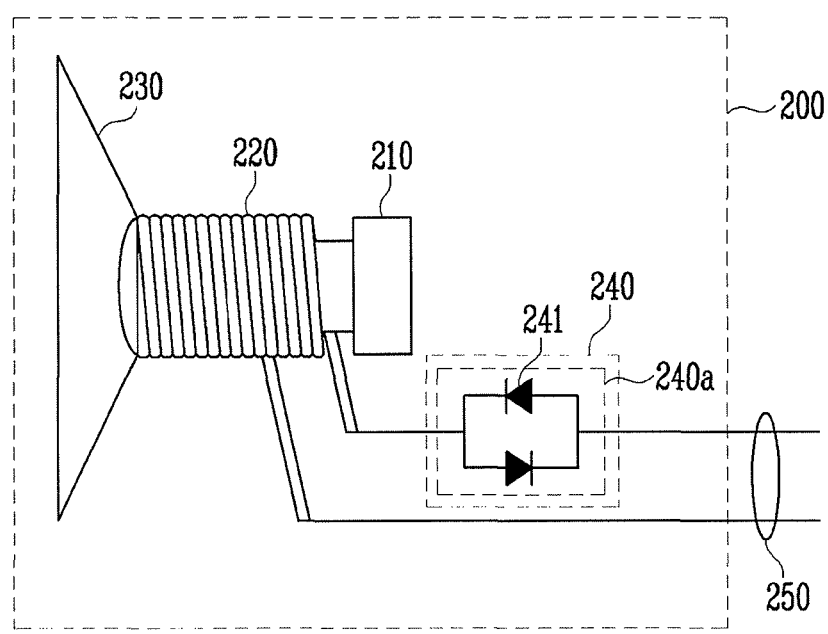
FIGS. 2A and 2B are schematic diagrams of a speaker which includes a device for preventing leakage of a weak signal according to an exemplary embodiment of the present invention.
Figure 2B:
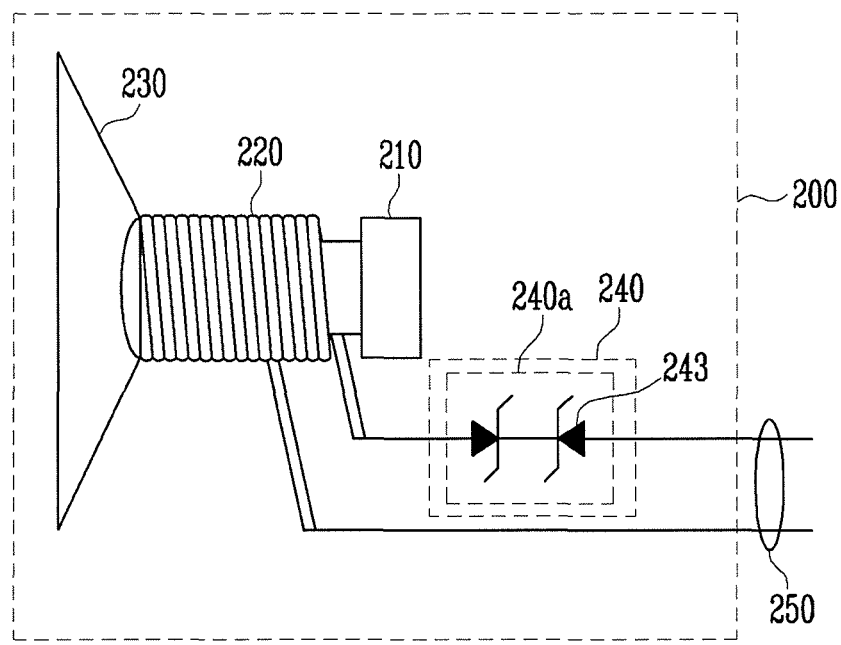

FIGS. 2A and 2B are schematic diagrams of a speaker 200 which includes a device 240 for preventing leakage of a weak signal according to an exemplary embodiment of the present invention.

Referring to FIGS. 2A and 2B, the speaker 200 includes a permanent magnet 210, a voice coil 220 surrounding the permanent magnet 210, a diaphragm 230 connected to one side of the voice coil 220, and the device 240 for preventing leakage of a weak signal from a speaker according to exemplary embodiments of the present invention. The device 240 is connected to one line of the voice coil 220 and becomes conductive only when a voltage difference between both sides is larger than a predetermined value.

According to an exemplary embodiment of the present invention, the speaker 200 has the same elements as the conventional speaker 100a, except the device 240.

The device 240 includes a bidirectional threshold element 240a configured to conduct only when the voltage difference between both sides is larger than the predetermined value.

The bidirectional threshold element 240a is composed of two parallel diodes 241 connected in an opposite direction, or two serial Zener diodes 243 connected in an opposite direction. In another exemplary embodiment, the bidirectional threshold element 240a is composed of at least one varistor.

Figure 3A:
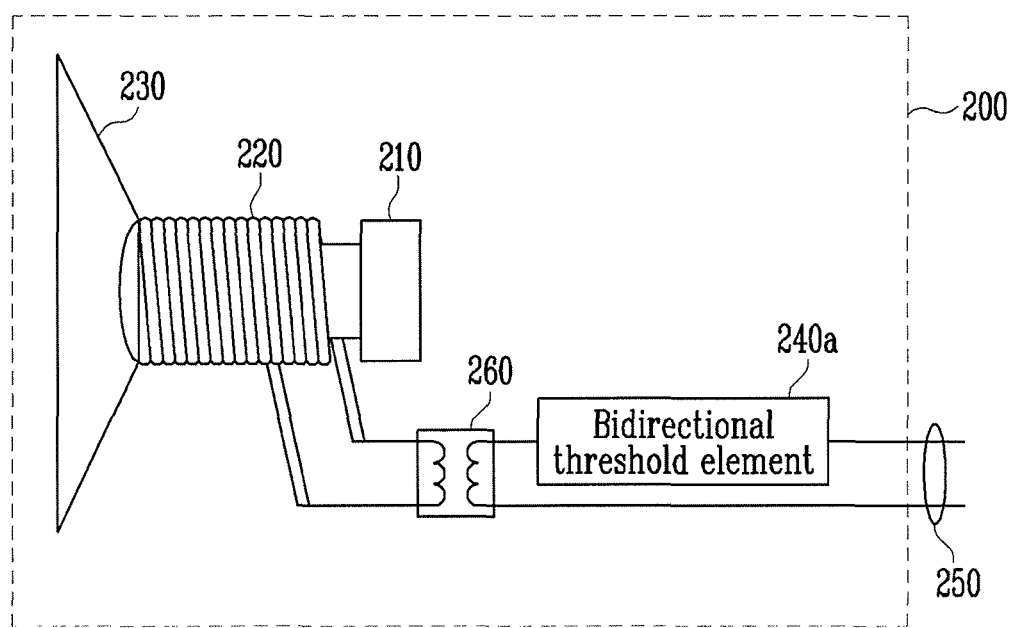
FIGS. 3A and 3B are schematic diagrams of a speaker which further includes a transformer, together with the device for preventing leakage of a weak signal according to an exemplary embodiment of the present invention.
Figure 3B:
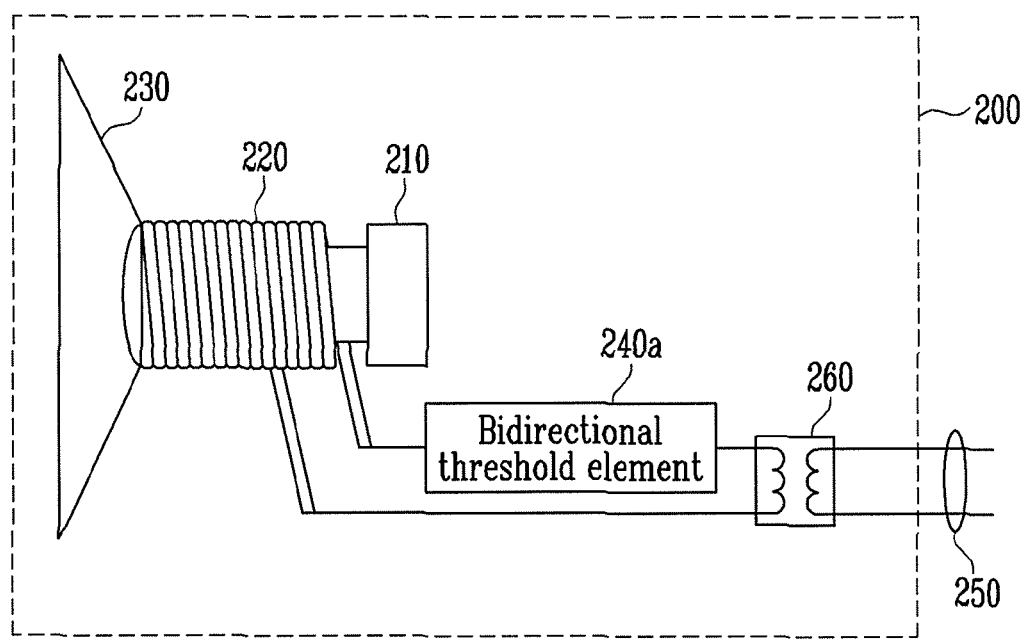

FIGS. 3A and 3B are schematic diagrams showing the speaker 200 which further includes a transformer 260 according to an exemplary embodiment of the present invention.

Referring to FIGS. 3A and 3B, when the speaker 200 further includes the transformer 260, the bidirectional threshold element 240a is directly connected to one of the speaker signal lines 250 or placed between the voice coil 220 and the transformer 260.

The position of the bidirectional threshold element 240a is determined by the magnitudes of leakage signals before and after the amplification by the transformer 260. This will be described below in detail.

First, if the threshold voltage of the bidirectional threshold element 240a is much higher than the magnitude of the leakage signal in the voice coil 220 and slightly higher than that of the leakage signal amplified by the transformer 260, the bidirectional threshold element 240a should be directly connected to one of the speaker signal lines 250 as shown in FIG. 3A.

Second, if the threshold voltage of the bidirectional threshold element 240a is slightly higher than the magnitude of the leakage signal in the voice coil 220 and lower than that of the leakage signal amplified by the transformer 260, the bidirectional threshold element 240a should be placed between the voice coil 220 and the transformer 260 as shown in FIG. 3B.

The reason why the position of the bidirectional threshold element 240a differs is to minimize the distortion of the speaker drive signal.

By the way, the bidirectional threshold element 240a becomes conductive unexpectedly due to noise or abnormal signals, then the weak signal in the voice coil 220 may be leaked from the speaker.

Accordingly, the present invention prevents the bidirectional threshold element 240a from being abnormally conductive by adding a low pass filter (LPF) and a limiter to block a signal, whose frequency is above the audible frequency, or a high pass filter (HPF) and a limiter to bypass an above-the-audible-frequency signal to another path. This will be described below in detail.

Figure 4A:
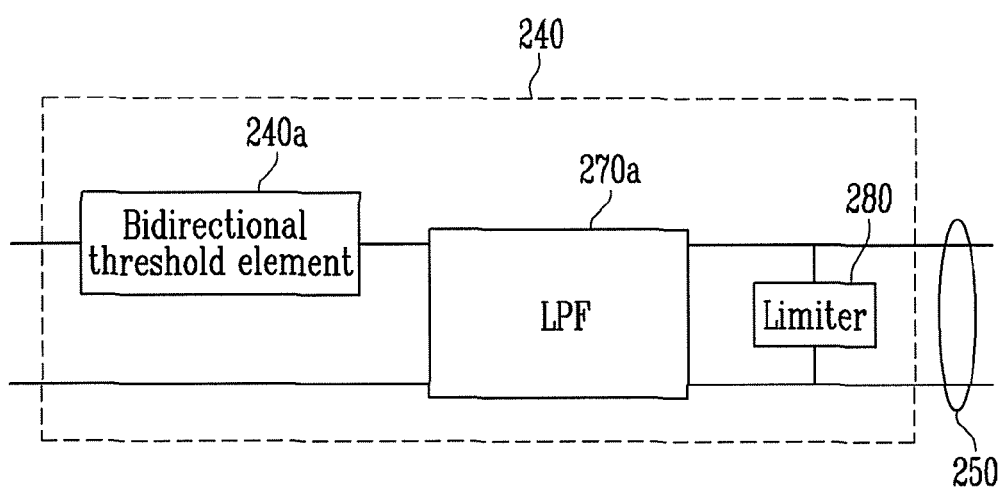
FIG. 4A shows an example in which a Low Pass Filter (LPF) and a limiter are connected to a bidirectional threshold element according to an exemplary embodiment of the present invention.
Figure 4B:
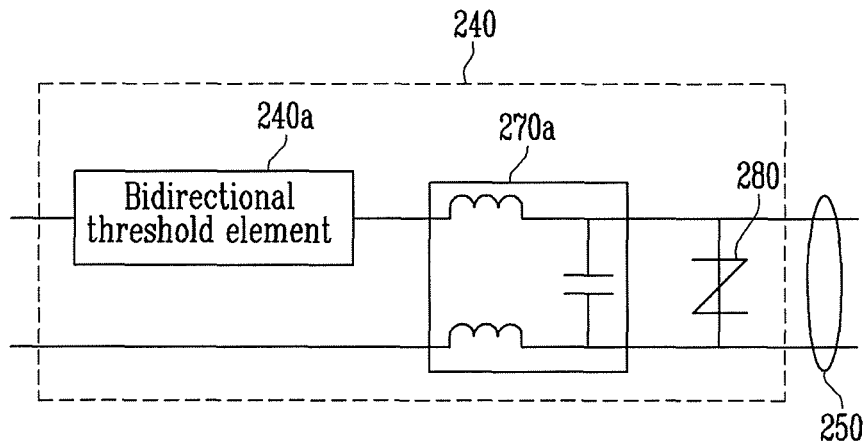
FIG. 4B shows an example in which the LPF of FIG. 4A is implemented with two inductors and one capacitor and the limiter of FIG. 4A is implemented with a varistor.

FIG. 4A shows an example in which an LPF 270a and a limiter 280 are connected to the bidirectional threshold element 240a according to an exemplary embodiment of the present invention, and FIG. 4B shows an example in which the LPF 270a of FIG. 4A is implemented with two inductors and one capacitor and the limiter 280 of FIG. 4A is implemented with a varistor.

Referring to FIGS. 4A and 4B, the LPF 270a passes an audio signal but blocks an above-the-audible-frequency signal and the limiter 280 restricts a voltage difference between the speaker signal lines 250 to a permitted value, thereby preventing the bidirectional threshold element 240a from being abnormally conductive.

Figure 5A:
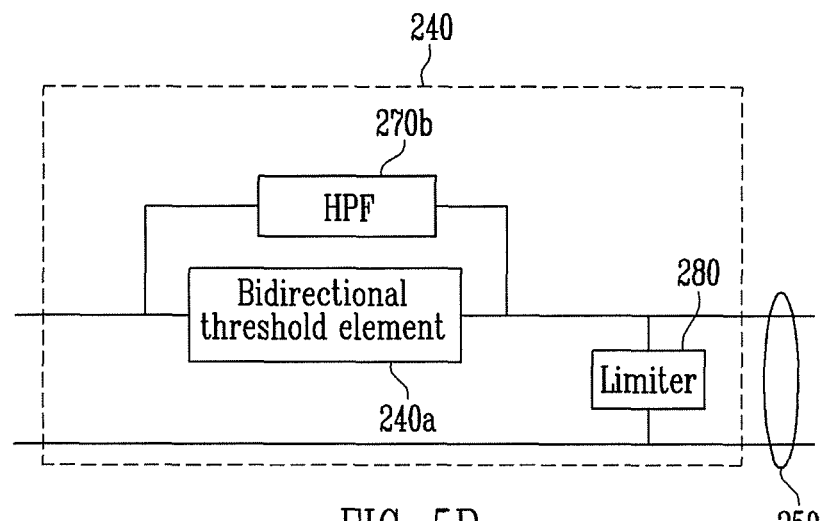
FIG. 5A shows an example in which a High Pass Filter (HPF) and a limiter are connected to a bidirectional threshold element according to an exemplary embodiment of the present invention.
Figure 5B:
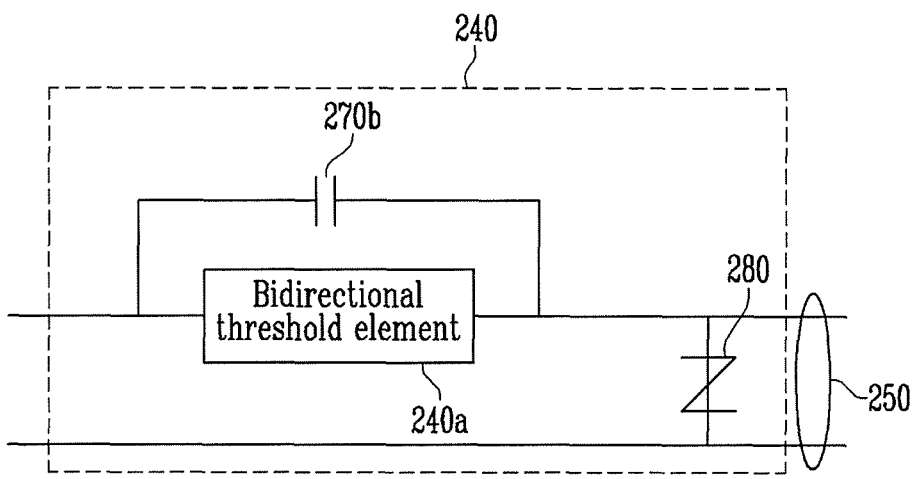
FIG. 5B shows an example in which the HPF of FIG. 5A is implemented with a capacitor and the limiter of FIG. 5A is implemented with a varistor.

FIG. 5A shows an example in which an HPF 270b and a limiter 280 are connected to the bidirectional threshold element 240a according to an exemplary embodiment of the present invention and FIG. 5B shows an example in which the HPF 270b of FIG. 5A is implemented with a capacitor and the limiter 280 of FIG. 5A is implemented with a varistor.

Referring to FIGS. 5A and 5B, the HPF 270b bypasses an above-the-audible-frequency signal but blocks an audio signal and the limiter 280 restricts a voltage difference between the speaker signal lines 250 to a permitted value, thereby preventing the bidirectional threshold element 240a from being abnormally conductive.

Operation of the bidirectional threshold element 240a according to an exemplary embodiment of the present invention will be described below in detail through test results.

Figure 6:
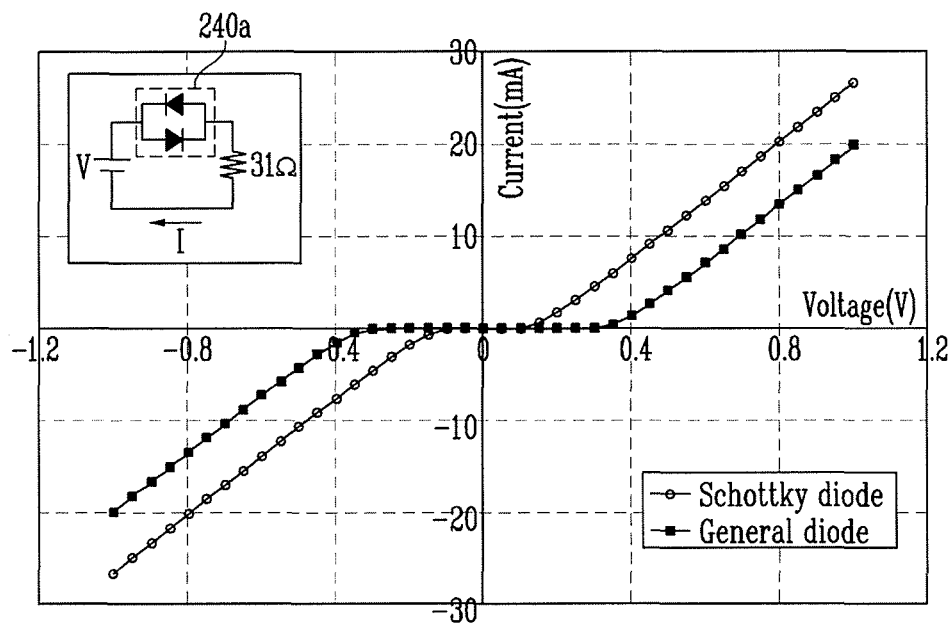
FIG. 6 is a measured graph of voltage-current characteristics of the bidirectional threshold element 240a according to an exemplary embodiment of the present invention.

FIG. 6 is a measured graph of voltage-current characteristics of the bidirectional threshold element 240a according to an exemplary embodiment of the present invention.

In the measurement, as changing the voltage of the power supply, we measured the current flowing through a resistor of 31Ω connected to the bidirectional threshold element 240a as shown in the left-top portion of FIG. 6. We measured two types of the bidirectional threshold element 240a, one of which was composed of general purpose diodes and the other was composed of Schottky diodes.

As shown in the graph of FIG. 6, there is a dead zone in which no substantial current flows. The dead zone is in a range of −0.3 V~+0.3 V in the case of general purpose diodes and in a range of −0.1 V~+0.1 V in the case of Schottky diodes.

That is, in the bidirectional threshold element 240a according to an exemplary embodiment of the present invention, the threshold voltage are 0.3 V and 0.1 V in case of general purpose diodes and Schottky diodes respectively.

Figure 7A:
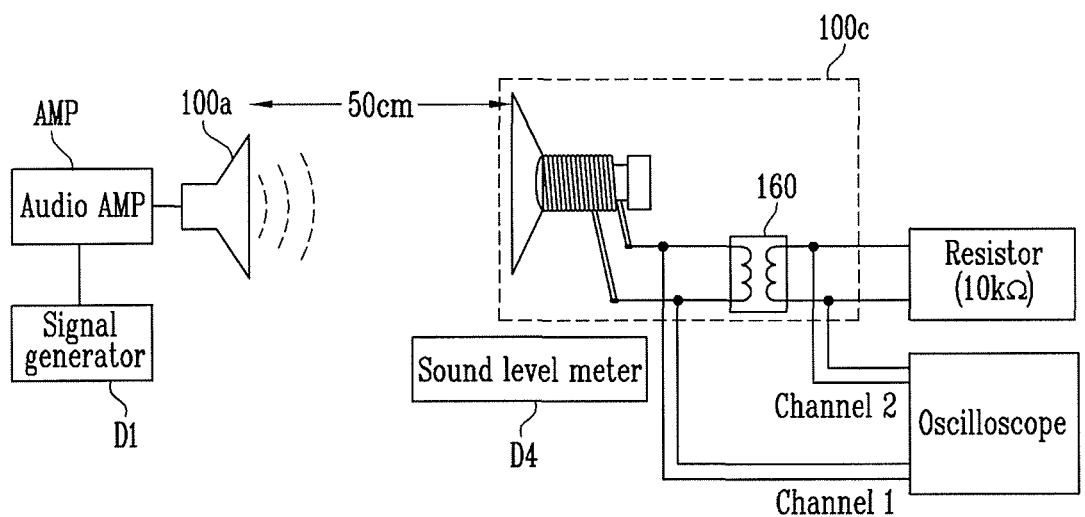
FIG. 7A shows a test setup for measuring a voltage amplitude of a weak signal generated in the conventional speaker as changing the input sound intensity to the speaker.
Figure 7B:
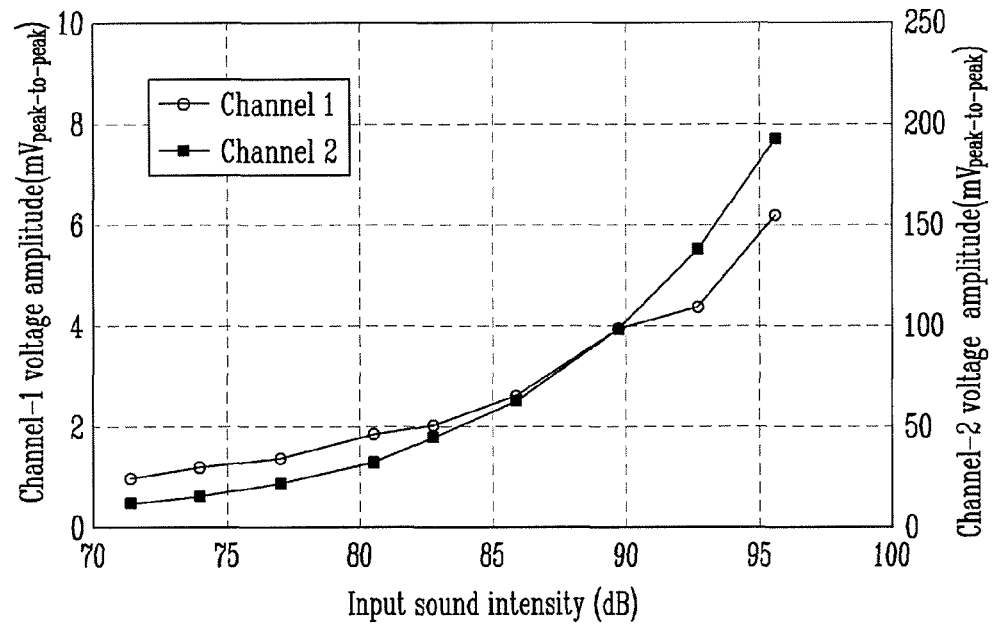
FIG. 7B is a graph showing a maximum voltage amplitude of a weak signal measured at the front (channel 1) and rear (channel 2) of a transformer 160 according to the input sound intensity to the conventional speaker in FIG. 7A.

FIG. 7A shows a test setup for measuring a voltage amplitude of a weak signal generated in the conventional speaker as changing the input sound intensity to the speaker; FIG. 7B is a graph showing a maximum voltage amplitude of a weak signal measured at the front (channel 1) and rear (channel 2) of a transformer 160 according to the input sound intensity to the conventional speaker in FIG. 7A.

By using a signal generator D1, an audio amplifier (AMP), and the conventional speaker 100a as shown in FIG. 7A, we radiated 1 kHz acoustic waves into the broadcast speaker for announcement 100c, placed 50 cm apart from the speaker 100a, and measured the sound intensity of the acoustic waves incident to the speaker 100c by using a sound level meter D4.

As changing the sound intensity, peak-to-peak voltage amplitudes of signals observed at the front (channel 1) and rear (channel 2) of the transformer 160 were measured by an oscilloscope. At this time, Inter-M CS-03 was used as the broadcast speaker for announcement, 100c.

At a conversation sound intensity of 70~75 dB as seen from FIG. 7B, the peak-to-peak voltage amplitudes of channel 1 and channel 2 were less than 2 mV and 25 mV respectively. At a high sound level of 95.6 dB such as noise in a factory, etc., the peak-to-peak voltage amplitudes of channel 1 and channel 2 were less than 7 mV and 200 mV respectively.

When the bidirectional threshold element 240a with the threshold voltage of 0.3 V, which is implemented by general purpose diodes, is connected to a point of channel 2 (see FIG. 3A) or the bidirectional threshold element 240a with the threshold voltage of 0.1 V, which is implemented by Schottky diodes, is connected to a point of channel 1 (see FIG. 3B), the leakage of a weak signal in voice coil can be prevented.

Figure 8A:
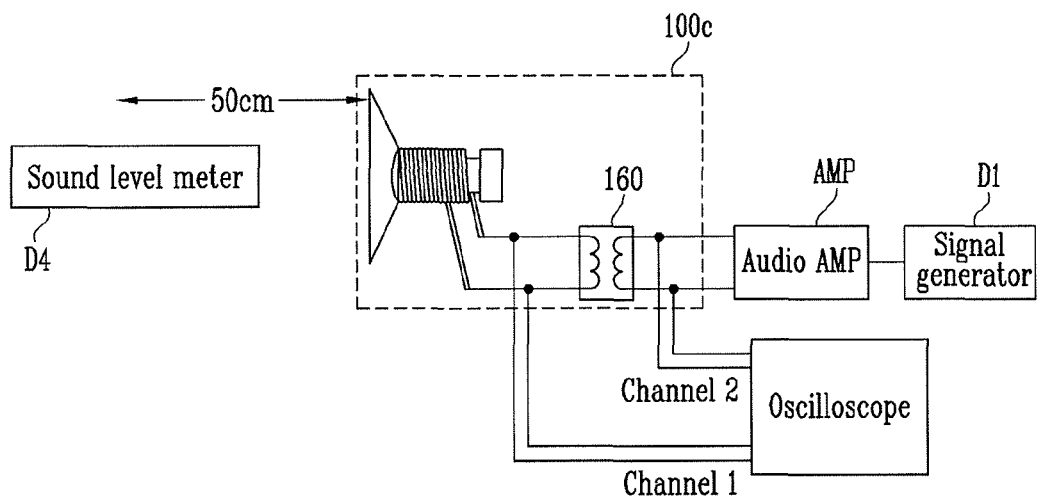
FIG. 8A shows a test setup for measuring a voltage amplitude of a normal speaker drive signal coming from an audio amplifier (AMP) as changing the output sound intensity measured by a sound level meter (D4) 50 cm apart from the broadcast speaker for announcement, 100C.
Figure 8B:
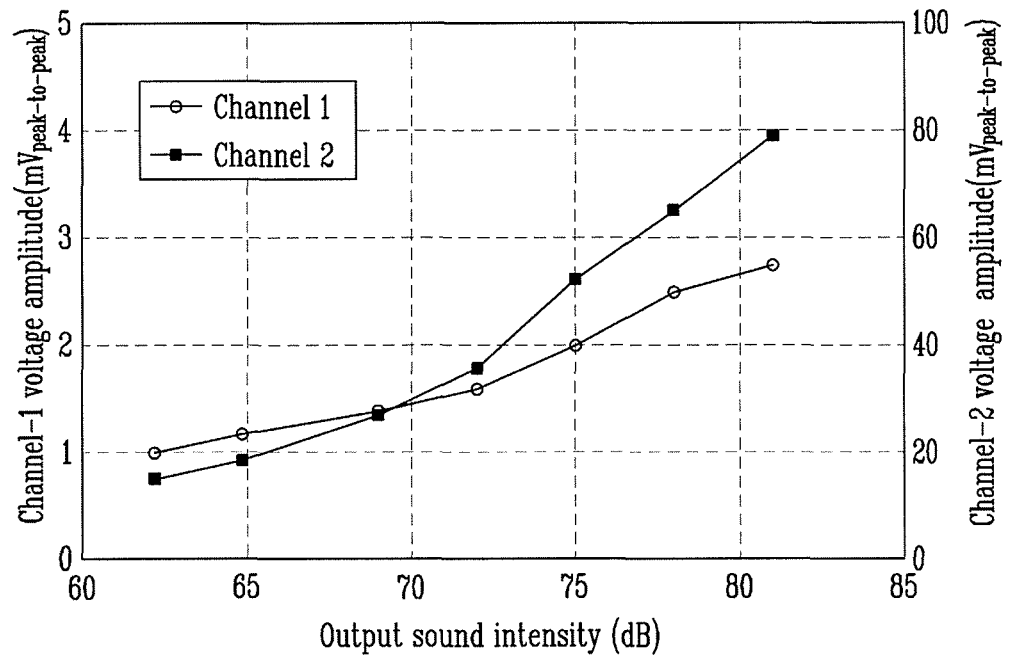
FIG. 8B is a graph showing a maximum voltage amplitude of a speaker drive signal measured at the front (channel 1) and rear (channel 2) of a transformer according to the output sound intensity from the speaker in FIG. 8A.

FIG. 8A shows a test setup for measuring a voltage amplitude of a normal speaker drive signal coming from an audio amplifier (AMP) as changing the output sound intensity measured by a sound level meter (D4) 50 cm apart from the broadcast speaker for announcement, 100C; FIG. 8B is a graph showing a maximum voltage amplitude of a speaker drive signal measured at the front (channel 1) and rear (channel 2) of a transformer according to the output sound intensity from the speaker in FIG. 8A.

By using a signal generator D1, an audio amplifier (AMP), and the broadcast speaker 100c as shown in FIG. 8A, we radiated 1 kHz acoustic waves into a sound level meter D4, placed 50 cm apart from the speaker 100c, and measured the sound intensity of the acoustic waves incident to the speaker 100c by using a sound level meter D4. As changing the sound intensity, peak-to-peak voltage amplitudes of signals observed at the front (channel 1) and rear (channel 2) of the transformer 160 were measured by an oscilloscope. At this time, Inter-M CS-03 was used as the broadcast speaker for announcement 100c Even at a sound intensity of 62.5 dB as seen from FIG. 8B, the peak-to-peak voltage amplitudes of channel 1 and channel 2 were at least 1 V and 15 V respectively.

In conclusion, we can install the bidirectional threshold element 240a implemented by Schottky diodes at a point of channel 1 or the bidirectional threshold element 240a implemented by general purpose diodes at a point of channel 2.

Figure 9:
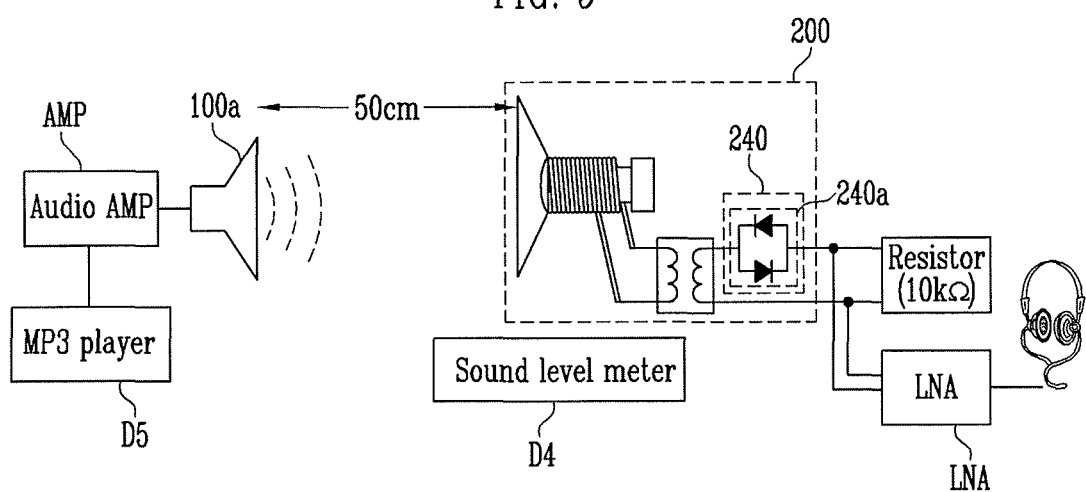
FIG. 9 shows a test setup for checking the effect of the signal leakage prevention device 240 according to an exemplary embodiment of the present invention.

FIG. 9 shows a test setup for checking the effect of the signal leakage prevention device 240 according to an exemplary embodiment of the present invention.

As shown in FIG. 9, we radiated the conversation sounds recorded in an MP3 player D5 by using the AMP and the conventional speaker 100a, and measured the sound intensity incident to the speaker 200, placed 50 cm apart from the speaker 100a, by using a sound level meter D4. Then, we tried to listen to that sound by wiretapping the speaker 200 and using a Low Noise Amplifier (LNA).

According to the results, even when the sound intensity was 90 dB, we could not listen to the conversation sounds due to the device 240. However, when the device 240 was removed from the speaker 200, we could clearly listen to the conversation sound, even when the intensity of incident sound was only 70 dB.

Figure 10:
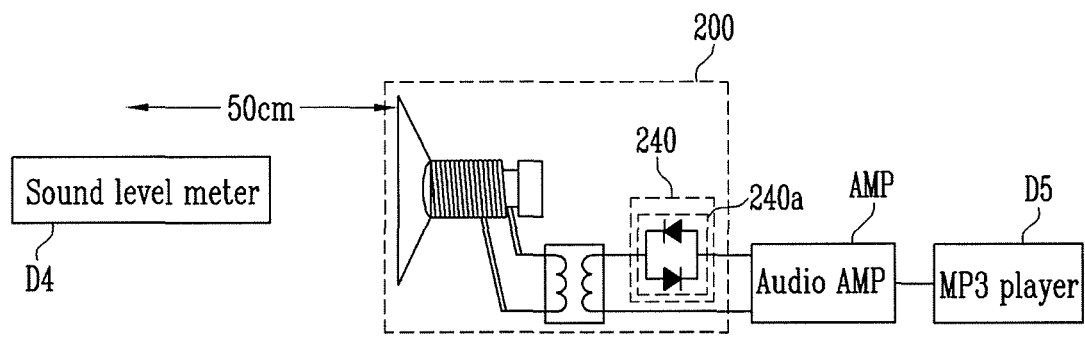
FIG. 10 shows a test setup for checking whether the speaker, which includes the signal leakage prevention device 240 according to an exemplary embodiment of the present invention, normally operates.

FIG. 10 shows a test setup for checking whether the speaker 200, which includes the signal leakage prevention device 240 according to an exemplary embodiment of the present invention, normally operates.

As shown in FIG. 10, we radiated the conversation sounds recorded in an MP3 player D5 by using the AMP and the speaker 200 including the device 240, and measured the sound intensity by using a sound level meter D4 paced 50 cm apart from the speaker 200.

In normal operation, the sound intensity was about 76 dB. However, in case that the device 240 was removed, the sound intensity increased into about 82 dB.

Even though the device 240 for preventing leakage of a weak signal reduces the sound intensity by about 6 dB, the present invention make a broadcast speaker for announcement operate normally without serious sound quality degradation while blocking a weak signal generated by the sounds around the speaker, thereby preventing tapping through the speaker.

While the present invention has been shown and described in connection with exemplary embodiments thereof, it will be apparent to those skilled in the art that various modifications can be made without departing from the spirit and scope of the invention as defined by the appended claims.

What is claimed is:

1. An apparatus for preventing leakage of a weak signal from a speaker, comprising:
    a transformer connected between a voice coil and a speaker signal line;
    a bidirectional threshold element between the transformer and the voice coil and configured to conduct only when a voltage difference between both sides of the bidirectional threshold element is larger than a predetermined threshold value of the bidirectional threshold element; and
    a limiter including a varistor for limiting a voltage difference between both sides of a speaker signal line to be less than a predetermined value,
    wherein the bidirectional threshold element includes two serial Zener diodes connected in an opposite direction and passes a first signal which is larger than the predetermined threshold value and blocks a second signal which is smaller than the predetermined threshold value.

2. The apparatus of claim 1, further comprising:
    a low pass filter for blocking a noise or an abnormal signal whose frequency is above the audible frequency.

3. The apparatus of claim 2, wherein the low pass filter includes inductors and capacitors.

4. The apparatus of claim 1, further comprising:
    a high pass filter for bypassing a noise or an abnormal signal whose frequency is above the audible frequency to another path.

5. The apparatus of claim 4, wherein the high pass filter includes a capacitor.

* * * * *